# (12) United States Patent
Shih et al.

(10) Patent No.: US 7,639,536 B2
(45) Date of Patent: Dec. 29, 2009

(54) STORAGE UNIT OF SINGLE-CONDUCTOR NON-VOLATILE MEMORY CELL AND METHOD OF ERASING THE SAME

(75) Inventors: Hung-Lin Shih, Hsinchu (TW);
Wen-Ching Tsai, Hsinchu (TW);
Yu-Hua Huang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 65 days.

(21) Appl. No.: 12/044,637

(22) Filed: Mar. 7, 2008

(65) Prior Publication Data
US 2009/0225601 A1 Sep. 10, 2009

(51) Int. Cl.
*G11C 16/04* (2006.01)
(52) U.S. Cl. .................. 365/185.1; 365/185.05
(58) Field of Classification Search ............. 365/185.1, 365/185.05, 185.29
See application file for complete search history.

(56) References Cited

U.S. PATENT DOCUMENTS

| | | | |
|---|---|---|---|
| 6,191,980 B1 * | 2/2001 | Kelley et al. ........... | 365/185.29 |
| 7,085,179 B2 * | 8/2006 | Park et al. ................ | 365/200 |
| 7,193,265 B2 | 3/2007 | Peng et al. | |
| 2009/0154253 A1 * | 6/2009 | Shiba et al. ............ | 365/185.28 |

* cited by examiner

*Primary Examiner*—Vu A Le
(74) *Attorney, Agent, or Firm*—Winston Hsu

(57) ABSTRACT

A storage unit of a single-conductor non-volatile memory cell is described, which includes an isolation layer in a substrate, a storage transistor and an erasing transistor. The storage transistor includes a first well of a first conductivity type in the substrate beside the isolation layer, a floating gate crossing over the isolation layer and including a first segment over the first well, and two source/drain regions of a second conductivity type in the first well beside the first segment of the floating gate. The erasing transistor includes a second well of the first conductivity type located in the substrate and separated from the first well by the isolation layer, a second segment of the floating gate over the second well, and a well pickup region of the first conductivity type in the second well beside the second segment of the floating gate.

18 Claims, 4 Drawing Sheets

STORAGE UNIT OF SINGLE-CONDUCTOR NON-VOLATILE MEMORY CELL AND METHOD OF ERASING THE SAME

BACKGROUND OF THE INVENTION

1. Field of Invention

This invention relates to a semiconductor device and operation thereof, and more particularly relates to structure of a storage unit of a single-conductor non-volatile memory cell and a method of erasing the same.

2. Description of Related Art

A traditional non-volatile memory cell is based on a stacked gate structure that includes a floating gate and a control gate thereover. For an embedded non-volatile memory apparatus, since the peripheral circuit devices are based on CMOS transistors including only one gate layer, extra fabricating steps have to be combined with the standard CMOS process to integrate the traditional stacked-gate non-volatile memory cells and the peripheral circuit devices on one chip.

To save the extra fabricating steps in traditional embedded non-volatile memory process, single-poly non-volatile memory has been provided, wherein each memory cell includes a storage transistor including a floating gate on a tunnel layer and two source/drain (S/D) regions in the substrate beside the floating gate, wherein at least one S/D region overlaps with the floating gate. In a writing process of such a storage transistor, hot electrons are drawn into the floating gate due to a positive potential thereof induced by a positive voltage applied to the S/D region overlapping with the floating gate.

Such a storage transistor can be erased through channel Fowler-Nordheim (FN) tunneling or edge FN tunneling in the prior art. In a channel FN erasing method, as shown in FIG. 1, a quite high voltage about 20V is applied to the substrate and the S/D regions grounded, so that electrons are ejected out of the floating gate 100 through FN tunneling. In an edge FN erasing method, as shown in FIG. 2, a high voltage about 12V is applied to the source region to draw the electrons from the floating gate 200.

Since the erasing voltages are quite high, a high-voltage (HV) P-well or a deep N-well that is not seen in a standard CMOS device is required for the conventional storage transistor of N-type or P-type. The HV P-well or the deep N-well still needs extra forming steps to be combined with the standard CMOS process.

SUMMARY OF THE INVENTION

Accordingly, this invention provides a storage unit of a single-conductor non-volatile memory cell, which can be erased with lower voltages and needs no HV P-well or deep N-well requiring extra forming steps not included in a standard CMOS process.

This invention also provides a method for erasing an above storage unit of this invention, characterized in allowing lower voltages to be applied for the erasing.

The storage unit of a single-conductor non-volatile memory cell of this invention includes an isolation layer in a substrate, a storage transistor and an erasing transistor. The storage transistor includes a first well of a first conductivity type in the substrate beside the isolation layer, a floating gate crossing over the isolation layer and including a first segment over the first well, and two source/drain regions of a second conductivity type in the first well beside the first segment of the floating gate. The erasing transistor includes a second well of the first conductivity type located in the substrate and separated from the first well by the isolation layer, a second segment of the floating gate over the second well, and a well pickup region of the first conductivity type in the second well beside the second segment of the floating gate.

The method of erasing an above storage transistor of this invention is described as follows. When the first conductivity type is N-type and the second one is P-type, a negative voltage is applied to at least one source/drain region and a positive voltage to the well pickup region, so as to remove electrons from the floating gate.

The second segment of the floating gate may be entirely over the second well, or partially over the second well and partially over the substrate outside of the second well while the substrate has the second conductivity type, or partially over the second well and partially over a third well of the second conductivity type located in the substrate and surrounding the second well at least. In the former case, the storage transistor may be erased through FN electron tunneling. In the later case, the storage transistor may be erased through band-to-band tunneling hot hole (BTBTHH) injection.

As compared with the conventional storage transistor of single-conductor non-volatile memory, the additional second well and the second segment of the floating gate in the storage transistor of this invention allow a positive voltage and a negative voltage that are both not high voltages to be applied for the erasing. Hence, no HV P-well or deep N-well that would need extra forming steps not included in a standard CMOS process is required to form.

In order to make the aforementioned and other objects, features and advantages of this invention comprehensible, a preferred embodiment accompanied with figures is described in detail below.

DESCRIPTION OF EMBODIMENTS

Figure 1:
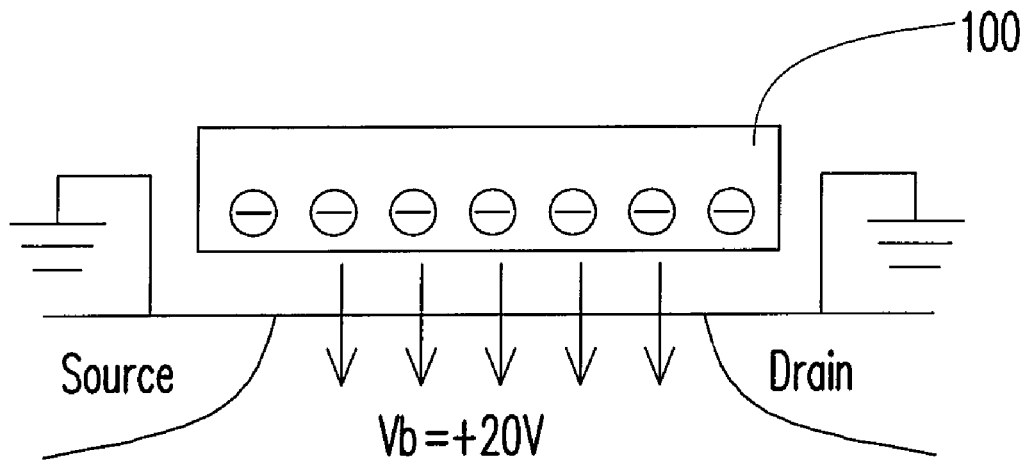
FIG. 1 illustrates a method of erasing a prior-art storage transistor of a single-conductor non-volatile memory cell through channel FN tunneling.
Figure 2:
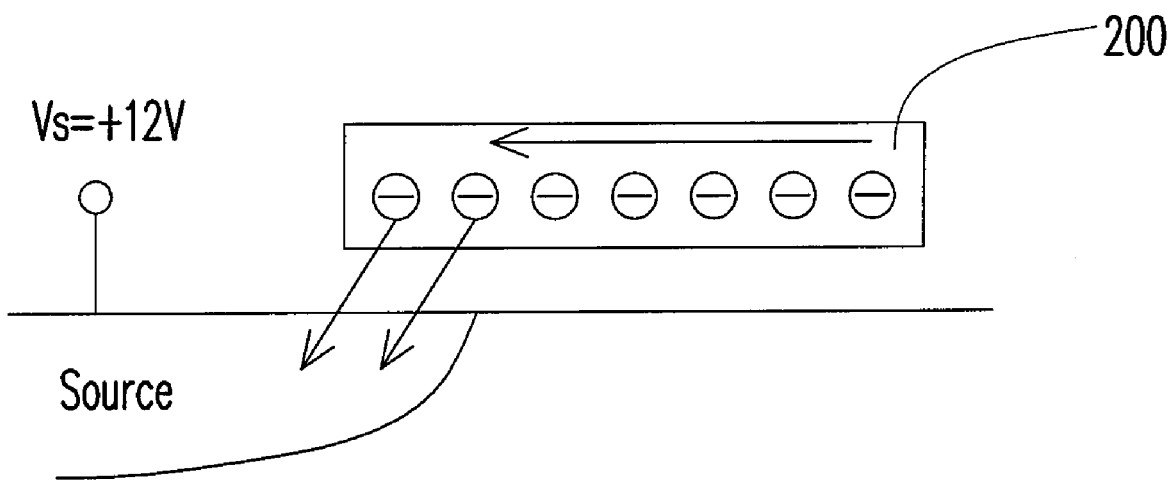
FIG. 2 illustrates another method of erasing a prior-art storage transistor of a single-conductor non-volatile memory cell through edge FN tunneling.
Figure 3:
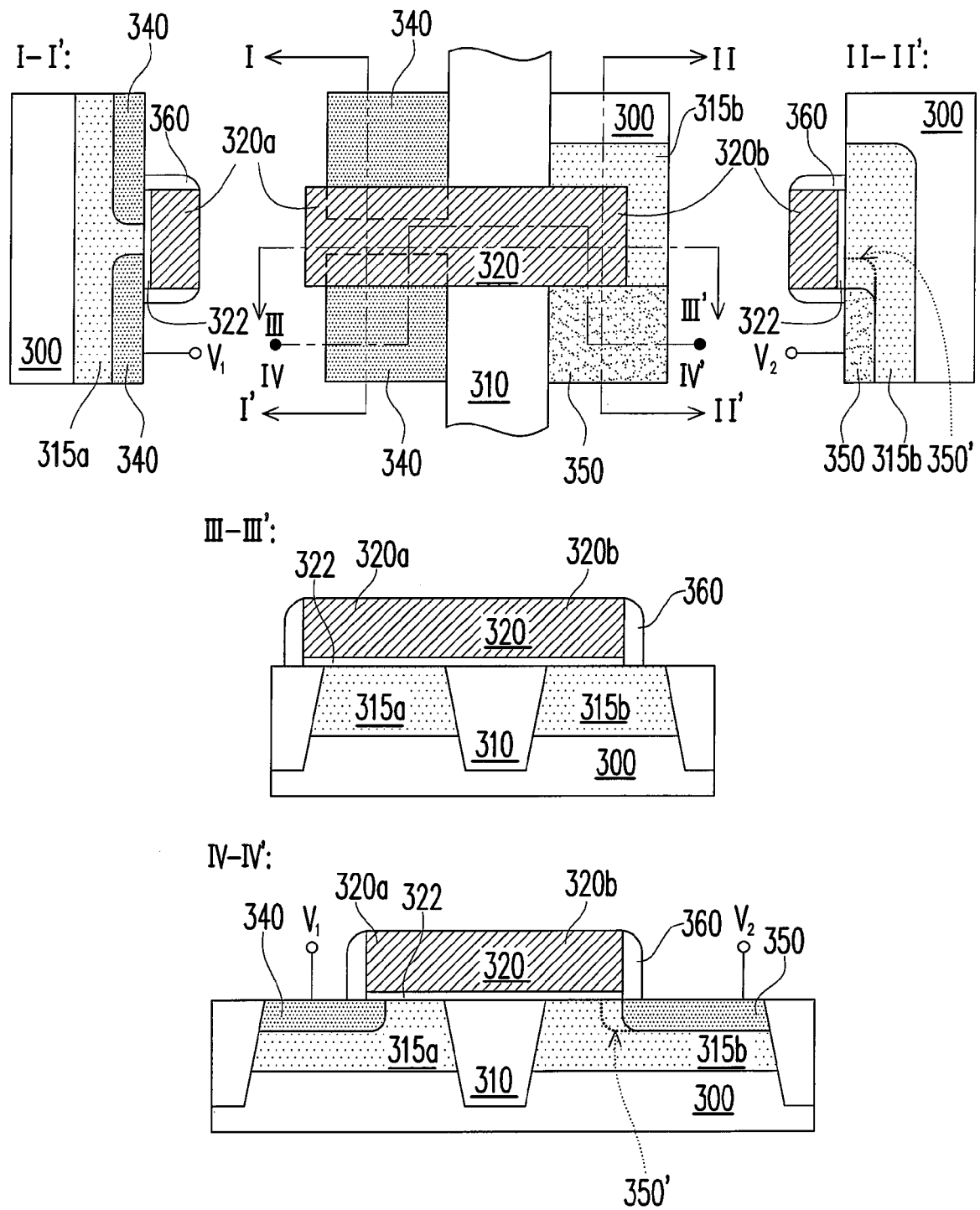
FIG. 3 illustrates a top view of a storage unit of a single-conductor non-volatile memory cell according to a first embodiment of this invention as well as three cross-sectional views of the same along lines I-I', II-II', III-III' and IV-IV' respectively.

FIG. 3 illustrates a top view of a storage unit of a single-conductor non-volatile memory cell according to the first embodiment of this invention as well as three cross-sectional views of the same along lines I-I', II-II', III-III' and IV-IV' respectively.

Referring to FIG. 3, the storage unit includes an isolation layer 310 in a semiconductor substrate 300, a storage transistor shown in I-I' and an erasing transistor shown in II-II'. The storage transistor includes a first well 315a of a first conductivity type in the substrate 300 beside the isolation layer 310, a floating gate 320 crossing over the isolation layer 310 and including a first segment 320a over the first well 315a, a portion of a tunneling layer 322 between the substrate 300 and the first segment 320a of the floating gate 320, and two source/drain regions 340 of a second conductivity type in the first well 315a beside the first segment 320a of the floating gate 320. The erasing transistor includes a second well 315b of the first conductivity type that is located in the substrate 300 and separated from the first well 315a by the isolation layer 310, a second segment 320b of the floating gate 320 over the second well 315b, another portion of the tunneling layer 322 between the substrate 300 and the second segment 320b of the floating gate 320, and a well pickup region 350 of the first conductivity type in the second well 315b beside the second segment 320b of the floating gate 320. It is possible that the first conductivity type is N-type and the second one P-type, or that the first conductivity type is P-type and the second one N-type The isolation layer 310 may be a shallow trench isolation (STI) layer including $SiO_2$. The first and second wells 315a and 315b separated by the isolation layer 310 can be formed simultaneously with the wells of the same (first) conductivity type in the peripheral device area (not shown). That is, the forming step of the first and second wells 315a and 315b can be integrated in a standard CMOS process.

The above floating gate 320 is disposed over the substrate 300, including a first segment 320a over the first well 315a and a second segment 320b entirely over the second well 315b. The material of the floating gate 320 is usually doped-polysilicon so that the single-conductor non-volatile memory cell is a single-poly non-volatile cell. The tunneling layer 322 may include silicon oxide.

One or both of the two source/drain regions 340 overlap(s) with the first segment 320a of the floating gate 320 for voltage coupling. On the other hand, though the well pickup region 350 shown in FIG. 3 does not overlap with the second segment 320b of the floating gate 320, the well pickup region (350') may alternatively be formed overlapping with the second segment 320b of the floating gate 320.

In addition, though the well pickup region 350 or 350' is formed at a front side of the second segment 320b of the floating gate 320 in FIG. 3, it may alternatively be formed at the right side of the same while the second well 315b is previously formed wider for its formation (not shown). Moreover, the above storage unit may also include a spacer 360 on the sidewall of the floating gate 320.

The above storage unit may be erased with FN electron tunneling. When the first conductivity type is N-type and the second one is P-type, a negative voltage $V_1$ is applied to at least one of the two P-type S/D regions 340 and a positive voltage $V_2$ to the N-type well pickup region 350. The difference between $V_1$ and $V_2$ is sufficient to induce FN electron tunneling so that the electrons previously stored in the floating gate 320 are drawn into the well pickup region 350.

On the contrary, when the first conductivity type is P-type and the second one is N-type, a positive voltage $V_1$ is applied to at least one of the two N-type S/D regions 340 and a negative voltage $V_2$ to the P-type well pickup region 350. The difference between $V_1$ and $V_2$ is sufficient to induce FN electron tunneling so that the electrons previously stored in the floating gate 320 are drawn into the S/D region 340.

Figure 4:
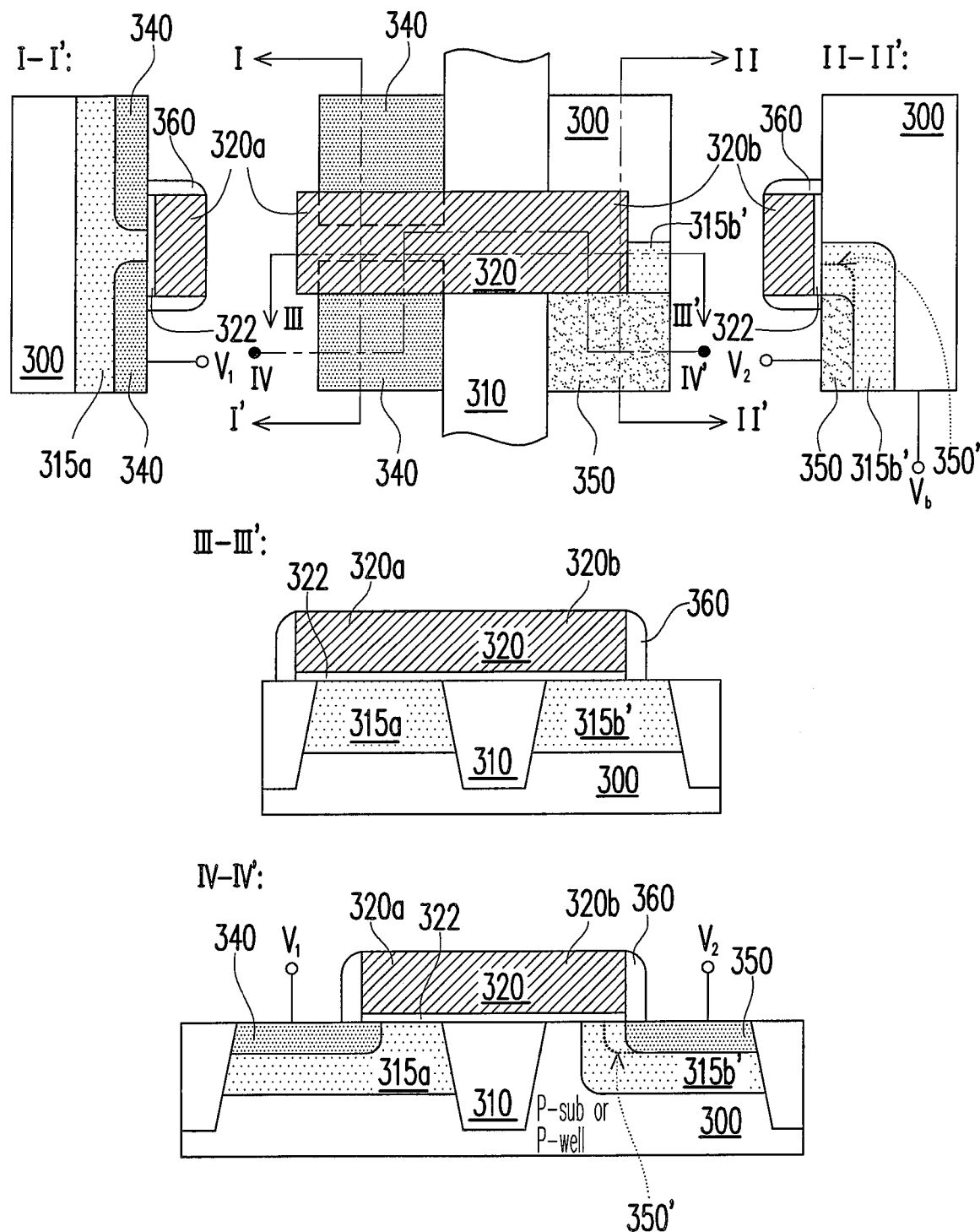
FIG. 4 illustrates a top view of a storage unit of a single-conductor non-volatile memory cell according to a second embodiment of this invention as well as two cross-sectional views of the same along lines I-I', II-II', III-III' and IV-IV' respectively.

In any of the above cases, $V_1$ and $V_2$ both are not high voltages needing a special design in the well structure of memory cell in the prior art, and it is feasible that the positive voltage ranges from 6V to 9V and the negative voltage ranges from −6V to −9V. In an example, the positive voltage is about 8V and the negative voltage about −8V, FIG. 4 illustrates a top view of a storage unit of a single-conductor non-volatile memory cell according to the second embodiment of this invention as well as two cross-sectional views of the same along lines I-I', II-II', III-III' and IV-IV' respectively.

The structure of the storage unit of the $2^{nd}$ embodiment is mostly the same as that of the storage transistor of the $1^{st}$ embodiment, except the following two aspects. First, the part 300 may be a substrate of the second conductivity type, or alternatively a third well of the second conductivity type located in a substrate and surrounding the second well at least. Also, the area of the second well 315b' is smaller than that of the second well 315 of the transistor in the $1^{st}$ embodiment, so that the second segment 320b of the floating gate 320 is partially over the second well 315b' and partially over the substrate or well 300 outside of the second well 315b'. Thus, a portion of the PN junction between the substrate or well 300 and the second well 315b' is right under the second segment 320b of the floating gate 320. Moreover, as mentioned above, the well pickup region may be formed not overlapping (350) with the second segment 320b of the floating gate 320 or alternatively be formed overlapping (350') with the same.

Further, though the second well 315b' in the $2^{nd}$ embodiment is arranged so that the PN junction right under the second segment 320b of the floating gate 320 extends in length direction of the floating gate 320, the second well may alternatively be arranged in any other manner if only a portion of the PN junction between the substrate/well 300 and the second well is right under the second segment 320b. For example, the second well 315b' may be formed apart from the left-side isolation layer 310 and crossing the second segment 320b of the floating gate 320 such that the PN junction right under the second segment 320b extends in the width direction of the floating gate 320.

When the first conductivity type is N-type and the second one P-type, the storage transistor may be erased through band-to-band tunneling hot hole (BTBTHH) injection. A negative voltage $V_1$ is applied to at least one of the two P-type S/D regions 340, a positive voltage $V_2$ to the N-type well pickup region 350 and a voltage $V_b$ lower than $V_2$, such as 0V, to the substrate 300. The difference between $V_b$ and $V_2$ is sufficient to generate BTBTHHs at the PN junction 300/315b' right under the second segment 320b of the floating gate 320. The holes are drawn in the floating gate 320 eliminating the electrons, due to the negative potential of the floating gate 320 induced by the negative voltage $V_1$ applied to the S/D region 340 overlapping with the first segment 320a.

In the above case, the negative voltage $V_1$ and the positive voltage $V_2$ both are not high voltages needing a special design in the well structure of memory cell in the prior art, and it is feasible that $V_2$ ranges from 6V to 9V and $V_1$ from −2V to −4V. In an example, the positive voltage is about 8V and the negative voltage about −3V.

Figure 5:
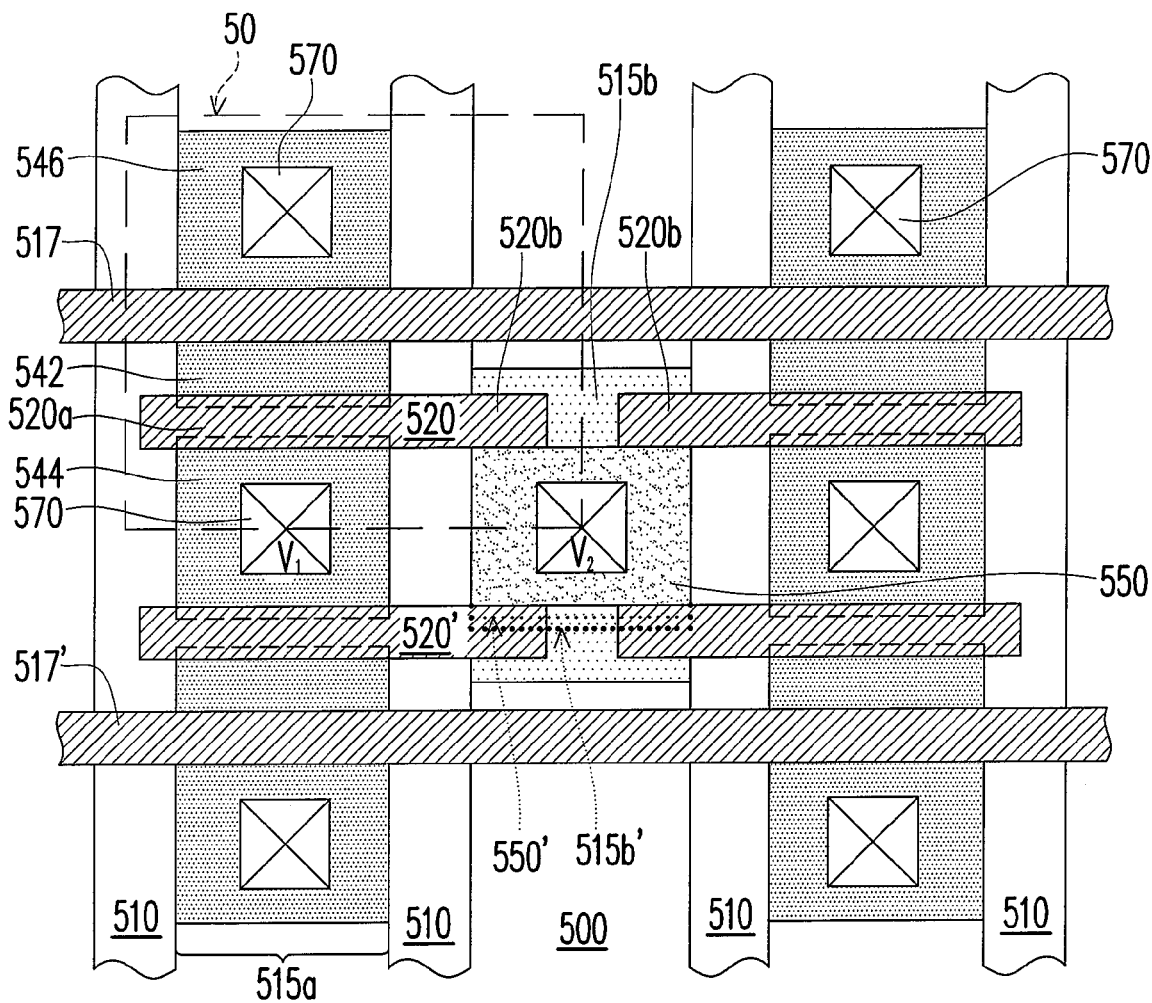
FIG. 5 illustrates the layout of four single-conductor non-volatile memory cells each including a storage unit according to the first/second embodiment of this invention.

FIG. 5 illustrates the layout of four single-conductor non-volatile memory cells each including a storage unit according to the first/second embodiment of this invention.

Referring to FIG. 5, a plurality of parallel linear isolation layers 510 is disposed in a semiconductor substrate 500. Two first wells 515a of a first conductivity type are located at two sides of one second well 515b that is a part of an erasing transistor, and are each separated from the second well 515b by an isolation layer 510. Each memory cell 50 includes a storage unit and a select transistor as described below, wherein the storage units of the four memory cells 50 share the one erasing transistor.

Except the second well 515b as a part of the erasing transistor shared by the storage units of the four memory cells 50, each storage unit also includes a floating gate 520 and doped regions 542 and 544 of a second conductivity type constituting a storage transistor. The floating gate 520 has a first segment 520a over one first well 515a and a second segment 520b over the second well 515b. The doped regions 542 and 544 act as S/Ds of the storage transistor in the first well 515a beside the first segment 520a.

The select transistor includes a select gate 517 and an S/D region 546, and shares the doped region 542 with the storage transistor. In addition, the storage transistor shares the doped region 544 with the storage transistor of the neighboring memory cell including another floating gate 520' and another select gate 517'.

The second segment 520b of each floating gate 520 may be entirely over the second well 515b, or be partially over the second well 515b' of the $1^{st}$ conductivity type and partially over the substrate or well 500 outside of the second well 515b' while the substrate or well 500 has the $2^{nd}$ conductivity type. The well pickup may be formed not overlapping (550) with the second segment 520b of the floating gate 520 or formed overlapping (550') with the same. The doped regions 544 and 546 as S/D regions and the well pickup region 550 or 550' are formed with contact plugs 570 thereon.

In writing process of the memory cell 50, the channel under the select gate 517 is turned on and different voltages are applied to the doped regions 544 and 546 such that electrons are injected into the floating gate 520 from the first segment 520a thereof. The second well 515b/515b' is floated in the writing process.

When a memory cell 50 shares a second well 515b over which the entire second segment 520b of the floating gate 520 is located, it may be erased through FN electron tunneling. The tunneling is induced by applying a negative voltage $V_1$ to the doped region 544 and a positive voltage $V_2$ to the well pickup 550/550' as the first/second conductivity type is N-type/P-type, or by applying a positive voltage $V_1$ to 544 and a negative voltage $V_2$ to 550/550' as the first/second conductivity type is P-type/N-type. The details of the erasing operation have been mentioned above.

When the second segment 520b of each floating gate 520 is partially over the second well 515b' and partially over the substrate or well 500 with a conductivity type different from that of the second well 515b' and the $1^{st}/2^{nd}$ conductivity type is N-type/P-type, the memory cell 50 may be erased through BTBTHH injection. The BTBTHH injection can be induced by applying a negative voltage $V_1$ to the doped region 544, a positive voltage $V_2$ to the well pickup region 550 and a voltage lower than $V_2$ to the substrate or well 500. The details of the erasing operation have been mentioned above.

According to the above embodiments, the second well and the second segment of the floating gate in the storage transistor of this invention allow a positive voltage and a second voltage that are both not high voltages to be applied for the erasing. Hence, no HV P-well or deep N-well needing extra steps not included in a standard CMOS process is required to form. That is, the storage transistor of this invention can be fabricated in a standard CMOS process.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A storage unit of a single-conductor non-volatile memory cell, comprising:
    an isolation layer in a semiconductor substrate;
    a storage transistor, comprising a first well of a first conductivity type in the substrate beside the isolation layer, a floating gate crossing over the isolation layer and including a first segment over the first well, and two source/drain regions of a second conductivity type in the first well beside the first segment of the floating gate; and
    an erasing transistor, comprising a second well of the first conductivity type that is located in the substrate and separated from the first well by the isolation layer, a second segment of the floating gate over the second well, and a well pickup region of the first conductivity type in the second well beside the second segment of the floating gate.

2. The storage unit of claim 1, wherein the second segment of the floating gate is entirely over the second well.

3. The storage unit of claim 2, wherein the well pickup region does not overlap with the floating gate.

4. The storage unit of claim 2, wherein the well pickup region overlaps with the floating gate.

5. The storage unit of claim 1, wherein the second segment of the floating gate is partially over the second well and partially over the substrate outside of the second well while the substrate has the second conductivity type, or is partially over the second well and partially over a third well of the second conductivity type located in the substrate and surrounding the second well at least.

6. The storage unit of claim 5, wherein the well pickup region does not overlap with the floating gate.

7. The storage unit of claim 5, wherein the well pickup region overlaps with the floating gate.

8. The storage unit of claim 1, wherein the first conductivity type is N-type and the second conductivity type is P-type.

9. The storage unit of claim 1, wherein the first conductivity type is P-type and the second conductivity type is N-type.

10. The storage unit of claim 1, wherein one of the two source/drain regions is coupled to a select transistor of the single-conductor non-volatile memory cell.

11. The storage unit of claim 10, wherein the one source/drain region is shared by the storage transistor and the select transistor.

12. The storage unit of claim 1, further comprising a spacer on a sidewall of the floating gate.

13. The storage unit of claim 1, wherein the floating gate comprises doped polysilicon.

14. A method of erasing a storage unit of a single-conductor non-volatile memory cell, wherein the storage transistor comprises:
    an isolation layer in a semiconductor substrate;
    a storage transistor, comprising a first well of a first conductivity type in the substrate beside the isolation layer, a floating gate crossing over the isolation layer and including a first segment over the first well, and two source/drain regions of a second conductivity type in the first well beside the first segment of the floating gate; and
    an erasing transistor, comprising a second well of the first conductivity type that is located in the substrate and separated from the first well by the isolation layer, a second segment of the floating gate over the second well, and a well pickup region of the first conductivity type in the second well beside the second segment of the floating gate; and the method comprising:
    applying a negative voltage to at least one of the two source/drain regions and a positive voltage to the well pickup region when the first conductivity type is N-type and the second conductivity type is P-type, or applying a positive voltage to at least one of the two source/drain regions and a negative voltage to the well pickup region when the first conductivity type is P-type and the second conductivity type is N-type, so as to remove electrons from the floating gate.

15. The method of claim 14, wherein the second segment of the floating gate is entirely over the second well, and a difference between the positive voltage and the negative voltage is sufficient to induce Fowler-Nordheim (FN) electron tunneling through the tunneling layer.

16. The method of claim 15, wherein the positive voltage ranges from 6V to 9V and the negative voltage ranges from −6V to −9V.

17. The method of claim 14, wherein the second segment of the floating gate is partially over the second well and partially over the substrate outside of the second well while the substrate has the second conductivity type or is partially over the second well and partially over a third well of the second conductivity type located in the substrate and surrounding the second well at least, the first conductivity type is N-type and the second conductivity type is P-type, further comprising:

applying to the substrate a voltage lower than the positive voltage, wherein a difference between the lower voltage and the positive voltage is sufficient to generate band-to-band tunneling hot holes (BTBTHHs) at a PN junction between the second well and the substrate.

18. The method of claim 17, wherein the positive voltage ranges from 6V to 9V and the negative voltage ranges from −2V to −4V.

* * * * *